US012698572B2

(12) United States Patent
Zhang et al.

(10) Patent No.: US 12,698,572 B2
(45) Date of Patent: Aug. 4, 2026

(54) 3D STRUCTURED INORGANIC NANOSCALE PRODUCT AND PRINTING METHOD AND APPLICATION THEREOF

(71) Applicant: Tsinghua University, Beijing City (CN)

(72) Inventors: Hao Zhang, Beijing City (CN); Jinghong Li, Beijing City (CN); Hongbo Sun, Beijing City (CN); Linhan Lin, Beijing City (CN); Fu Li, Beijing City (CN); Shaofeng Liu, Beijing City (CN); Wangyu Liu, Beijing City (CN); Zhengwei Hou, Beijing City (CN)

(73) Assignee: Tsinghua University, Beijing City (CN)

( * ) Notice: Subject to any disclaimer, the term of this patent is extended or adjusted under 35 U.S.C. 154(b) by 287 days.

(21) Appl. No.: 18/679,158

(22) Filed: May 30, 2024

(65) Prior Publication Data

US 2024/0410079 A1 Dec. 12, 2024

(30) Foreign Application Priority Data

Jun. 6, 2023 (CN) ......................... 202310666240.4

(51) Int. Cl.
*C30B 29/16* (2006.01)
*B33Y 10/00* (2015.01)
(Continued)

(52) U.S. Cl.
CPC .............. *C30B 29/16* (2013.01); *B33Y 10/00* (2014.12); *B33Y 70/00* (2014.12); *B33Y 80/00* (2014.12); *B82Y 40/00* (2013.01)

(58) Field of Classification Search
CPC ........... C30B 29/16; C30B 1/00; B33Y 10/00; B33Y 70/00; B33Y 80/00; B82Y 40/00
See application file for complete search history.

(56) References Cited

U.S. PATENT DOCUMENTS 11,085,112 B2 * 8/2021 Hawkins ........... C23C 16/45521
2017/0182711 A1 * 6/2017 Ederer .................. B29C 64/153
(Continued)

FOREIGN PATENT DOCUMENTS

EP 3300876 A1 * 4/2018 ............. B29C 64/20
EP 3620291 A1 * 3/2020 ............. B29C 64/35
WO WO-2017014785 A1 * 1/2017 ........... B29C 64/112

OTHER PUBLICATIONS

Yee et al., "3D Chemical Reactors: In-Situ Materials Synthesis to Advance Vat Photopolymerization," Polymer International, Dec. 11, 2020, 32 pages.

(Continued)

*Primary Examiner* — Robert M Kunemund
(74) *Attorney, Agent, or Firm* — Hanley, Flight & Zimmerman, LLC

(57) ABSTRACT

The present disclosure provides a 3D structured inorganic nanoscale product and a printing method and application thereof. The printing method includes the following steps: (1) mixing an inorganic nanocrystal and a photosensitive crosslinkable compound in a solvent to obtain a printing solution; wherein the inorganic nanocrystal has a ligand containing a carbon-hydrogen bond on the surface thereof; (2) obtaining a 3D printed product using laser 3D printing; wherein the photosensitive crosslinkable compound is a nitrene-based photosensitive crosslinking agent and/or a carbene-based photosensitive crosslinking agent. The method achieves the printing of semiconductor materials, metals, and metal oxide materials with submicron precision and any complex 3D structures through light-triggered chemical covalent bonding of ligands. The nanomaterials in the printed 3D structures retain their inherent morphology, and electrical and optical properties.

20 Claims, 6 Drawing Sheets

(51) Int. Cl.
*B33Y 70/00* (2020.01)
*B33Y 80/00* (2015.01)
*B82Y 40/00* (2011.01)

(56) References Cited

U.S. PATENT DOCUMENTS

2021/0187610 A1* 6/2021 Jeng ...................... B22F 10/322
2022/0126518 A1* 4/2022 Arnon ................... B29C 64/295

OTHER PUBLICATIONS

Lepage et al., "A broadly applicable cross-linker for aliphatic polymers containing C—H bonds," Polymer Chemistry, vol. 366, Nov. 15, 2019, 5 pages.
Rui et al., "Advances in biological application of photo-crosslinking technique," Chinese Optics, vol. 11, No. 3, Jun. 2018, 15 pages. [English abstract provided].

* cited by examiner

3D STRUCTURED INORGANIC NANOSCALE PRODUCT AND PRINTING METHOD AND APPLICATION THEREOF

CROSS-REFERENCE TO RELATED APPLICATIONS

This application claims priority to Chinese Patent Application No. 202310666240.4, filed on Jun. 6, 2023, which is hereby incorporated by reference in its entirety.

TECHNICAL FIELD

The present disclosure belongs to the field of 3D printing of inorganic nanomaterial, and relates to a 3D printing method of an inorganic nanomaterial based on ligand chemistry.

BACKGROUND OF ART

Additive manufacturing, also known as 3D printing, is a revolutionary technology that has been used widely. In addition to use in rapid and personalized manufacturing of prototype workpieces and art production, 3D printing technology has important applications in emerging fields such as flexible electronics, metamaterials, and biological scaffolds. However, the materials for current 3D printing are mainly limited to polymers or metals, and cannot be used to print materials with important optical, electrical, and magnetic properties, such as inorganic semiconductors or inorganic metal oxides. The reason is that the process of printing to form a 3D structure (especially a hollow structure) requires the formation of strong chemical bonds between atoms or molecules of the material to provide a mechanical support for the 3D structure. For example, in processes such as photocuring or laser melting commonly used in 3D printing, strong metallic bonds or covalent bonds are easily formed between metals or polymer molecules. However, it is difficult for semiconductors or metal oxides to form bonds during the printing. Therefore, it is difficult to achieve 3D printing of semiconductors or metal oxides with existing 3D printing technology.

On the other hand, 3D micro or nano structures of semiconductors or metal oxides have important application prospects in chiral optics, optical antennas, electronic devices, sensing and the like. The development of 3D printing methods for such materials is of significance to the field of additive manufacturing and fundamental research. In previous reports, by using nanoscale semiconductors (quantum dots) as raw materials, and by selecting a specific combination of quantum dots and ligands (requiring both mercapto group and carboxyl group), 3D printing of quantum dot semiconductor materials of some components can be achieved, and the printing accuracy can reach about 100 nanometers (3D nanoprinting of semiconductor quantum dots by photoexcitation-induced chemical bonding, Science, 2022, 377, 1112). However, this method relies on strong two-photon absorption of quantum dots and requires a specific energy level distribution between the quantum dots and the ligands. Thus it can only be used for a few inorganic semiconductor materials and cannot be applied to many other semiconductor materials, and it can be hardly used to print semiconductor oxides, metals or the like.

In summary, there is still a lack of universal 3D printing methods for inorganic semiconductors, metal oxides and other electrically/optically/magnetically active nanomaterials, and innovations of 3D printing methods for inorganic nanomaterials in principle, mechanism and technology are needed.

SUMMARY OF THE INVENTION

In view of the above problems, an object of the present disclosure is to provide a 3D structured inorganic nanoscale product and printing method and application thereof. The 3D structure obtained by the printing method retains the inherent electronic and optical properties of the original nanocrystal material, and the printing resolution is high and applicable in printing of nanocrystals with a variety of different components (different nanocrystal materials) and different geometric structures.

In order to achieve the above object, the present disclosure provides a 3D printing method applicable to inorganic nanomaterials, including the steps of:

(1) mixing an inorganic nanocrystal and a photosensitive crosslinkable compound in a solvent to obtain a printing solution; wherein the inorganic nanocrystal has a ligand containing a carbon-hydrogen bond on the surface thereof;

(2) performing laser 3D printing to obtain a 3D printed product;

wherein the photosensitive crosslinkable compound is a nitrene-based photosensitive crosslinking agent and/or a carbene-based photosensitive crosslinking agent.

According to a specific embodiment of the present disclosure, preferably, the inorganic nanocrystal has a ligand containing 4 to 18 carbon-hydrogen bonds on the surface thereof.

According to a specific embodiment of the present disclosure, the printing method is applicable to various nanocrystals having (for example, coated with) original ligands containing a carbon-hydrogen bond on the surfaces thereof. The nanocrystals refer to nanoscale crystalline materials, or nanoparticles having a crystalline structure, specifically to single-phase or multi-phase polycrystals composed of nanoscale (for example, 1-1000 nm) grains.

According to a specific embodiment of the present disclosure, preferably, the inorganic nanocrystal includes one or more of a metal nanocrystal, a metal oxide nanocrystal, and a semiconductor material nanocrystal.

According to a specific embodiment of the present disclosure, preferably, the inorganic nanocrystal includes one or more of a Group II-VI nanocrystal, a Group III-V nanocrystal, a Group IV-VI nanocrystal, a Group IV nanocrystal, a Group I-VI nanocrystal, a Group I—III-VI nanocrystal, a metal halide perovskite material, a core-shell structured semiconductor nanocrystal, a metal nanocrystal, and a metal oxide nanocrystal.

According to a specific embodiment of the present disclosure, preferably, the Group II-VI nanocrystal includes one or more of CdS, CdSe, CdTe, ZnS, ZnSe, ZnTe, HgS, HgSe, HgTe, $Cd_xZn_{1-x}Se$, $Cd_xZn_{1-x}S$, Hg, $Cd_{1-x}S$, $Hg_xCd_{1-x}Se$, $Hg_xCd_{1-x}Te$, and $Hg_xZn_{1-x}Te$, where $0<x<1$.

According to a specific embodiment of the present disclosure, preferably, the group III-V nanocrystal includes one or more of InP, InAs, InN, InSb, $InAs_{1-x}Sb_x$, GaAs, GaN, GaP, GaSb, AlN, AlP, and AlAs, where $0<x<1$.

According to a specific embodiment of the present disclosure, preferably, the group IV-VI nanocrystal includes one or more of PbS, PbSe, and PbTe.

According to a specific embodiment of the present disclosure, preferably, the core-shell structured semiconductor nanocrystal includes one or more of CdSe/ZnS, CdSe/CdS, CdTe/CdSe, PbS/CdS, ZnSe/CdS, ZnSe/CdSe, $CuInS_2$/$CuInS_2$, $CuInS_2$/ZnS, HgSe/CdS, HgSe/CdSe, HgSe/CdSe/CdS, and $Cd_{1-x}Zn_xS$/ZnS, where 0<x<1.

According to a specific embodiment of the present disclosure, preferably, the shape of the core-shell structured semiconductor nanocrystal includes one or more of spherical, rod-like, linear, flaky, and four-jaw shapes.

According to a specific embodiment of the present disclosure, preferably, the metal nanocrystal includes one or more of Au nanocrystal, Ag nanocrystal, and Pt nanocrystal.

According to a specific embodiment of the present disclosure, preferably, the metal oxide nanocrystal includes one or more of $TiO_2$, $In_2O_3$, $CeO_2$, $ZrO_2$, and ZnO.

According to a specific embodiment of the present disclosure, preferably, the size of the inorganic nanocrystal is 1-1000 nm, for example, 1 nm, 2 nm, 3 nm, 4 nm, 5 nm, 6 nm, 7 nm, 8 nm, 9 nm, 10 nm, 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1000 nm, or a range consisting of two of the above values as endpoints.

According to a specific embodiment of the present disclosure, preferably, the photosensitive crosslinkable compound is an azide-based compound or a diazirine-based compound, such as a nitrene-based or carbene-based photosensitive crosslinkable compound. When the produced nitrene or carbene intermediate forms a covalent chemical bond with the ligand of the nanocrystal, on the one hand it reduces the colloidal stability of the nanocrystal in the solvent to cause deposition, and on the other hand it provides mechanical support for the deposited micro or nano 3D structure.

According to a specific embodiment of the present disclosure, preferably, the azide-based compound has a structure represented by Formula I:

Formula I

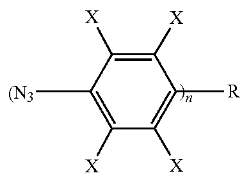

In Formula I, X is each independently selected from For an alkyl, and at least one X is F, more preferably, each X is F; R is selected from a hydrocarbyl and derivatives thereof, an aryl and derivatives thereof, or an ester group and derivatives thereof, n≥2, R is more preferably a $C_{1-8}$ hydrocarbyl and derivatives thereof, or a $C_{6-12}$ aryl and derivatives thereof; $C_{1-8}$ hydrocarbyl and the derivatives thereof may be, for example, methyl, ethyl, isopropyl, n-butyl, n-pentyl, n-hexyl, cyclohexyl, n-octyl and the like, and $C_{6-12}$ aryl may be, for example, phenyl, biphenyl, naphthyl and the like; n is more preferably 2, 3, 4, 5 or 6; more preferably, R contains one or more heteroatom(s) of O, N, P, and halogen atoms.

According to a specific embodiment of the present disclosure, preferably, the diazirine-based compound has a structure represented by Formula II:

Formula II

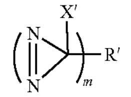

In Formula II, X' is a group that stabilizes a carbene intermediate obtained by removing nitrogen from the compound containing the diazirine group and enables the insertion reaction, and may be selected from H, halogen, a hydrocarbyl and derivatives thereof, and an ether group and derivatives thereof, such as Br, H, $—CH_2CH_3$, $—CCl_3$, $—OCH_2CH_3$ and the like; R' is a hydrocarbyl or derivatives thereof; more preferably, R' contains one or more of functional groups such as ester group, amide bond, an aryl, and an ether group, and m≥2. The diazirine compound can allow the carbene intermediate formed after removing nitrogen from the diazirine group to subsequently carry out a ligand insertion reaction non-selectively for crosslinking.

According to a specific embodiment of the present disclosure, preferably, the photosensitive crosslinkable compound is one or more of 1,5-bis(4-azido-2,3,5,6-tetrafluorophenyl)-1,4-pentadien-3-one, ethylene glycol bis(4-azido-2,3,5,6-tetrafluorobenzoate), N,N-dimethyl-N,N-trimethylenebis(4-azido-2,3,5,6-tetrafluorobenzamido) ammonium iodide, and 3,3'-((perfluorobutane-1,4-diyl)bis(4,1-phenylene))bis(3-(trifluoromethyl)-3H-diaziridine.

The structure of 1,5-bis(4-azido-2,3,5,6-tetrafluorophenyl)-1,4-pentadien-3-one (M460) is:

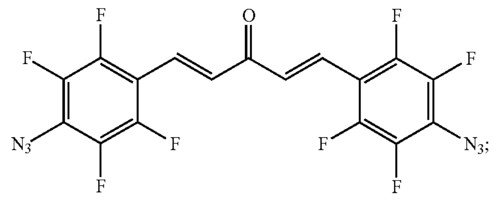 [SMILES: [N-]=[N+]=Nc1c(F)c(F)c(/C=C/C(=O)/C=C/c2c(F)c(F)c(N=[N+]=[N-])c(F)c2F)c(F)c1F]

the structure of ethylene glycol bis(4-azido-2,3,5,6-tetrafluorobenzoate) (M496) is:

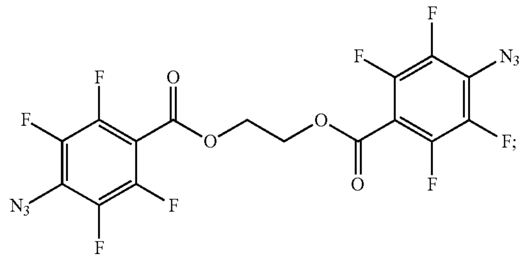 [SMILES: [N-]=[N+]=Nc1c(F)c(F)c(C(=O)OCCOC(=O)c2c(F)c(F)c(N=[N+]=[N-])c(F)c2F)c(F)c1F]

the structure of N,N-dimethyl-N,N-trimethylenebis(4-azido-2,3,5,6-tetrafluorobenzamido)ammonium iodide (DBTAI) is:

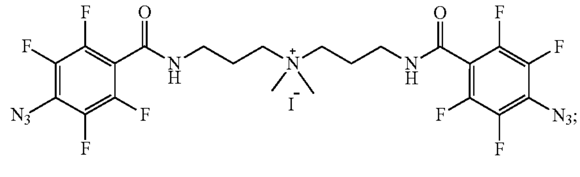 [SMILES: C[N+](C)(CCCNC(=O)c1c(F)c(F)c(N=[N+]=[N-])c(F)c1F)CCCNC(=O)c1c(F)c(F)c(N=[N+]=[N-])c(F)c1F ; [I-]]

the structure of 3,3'-((perfluorobutane-1,4-diyl)bis(4,1-phenylene))bis(3-(trifluoromethyl)-3H-diazirine (M570) is:

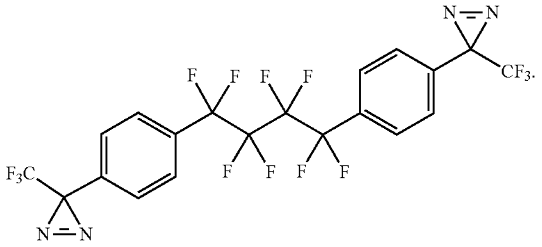 [SMILES: FC(F)(F)C1(c2ccc(C(F)(F)C(F)(F)C(F)(F)C(F)(F)c3ccc(C4(C(F)(F)F)N=N4)cc3)cc2)N=N1]

According to a specific embodiment of the present disclosure, preferably, the absorption wavelength range of the photosensitive crosslinkable compound and the laser wavelength for 3D printing are consistent with single-photon absorption or two-photon absorption. The process is that the photosensitive crosslinkable molecules produce single-photon absorption or two-photon absorption under laser irradiation, and the azido functional group in the crosslinkable molecules decomposes to produce unstable intermediate group, singlet nitrene, which is an electron-deficient monovalent nitrogen reactive intermediate and will undergo a carbon-hydrogen insertion reaction with the ligand molecules on the surface of the nanocrystals in the solution, and ultimately the nanocrystals are crosslinked and deposited in the structure, as shown in FIG. 2.

According to a specific embodiment of the present disclosure, preferably, the ligand on the surface of the inorganic nanocrystal has $C_3$-$C_{24}$ carbon chain as the main chain, which preferably contains carbon-hydrogen bonds; under focused laser beam irradiation, the photosensitive molecules can react with the ligands on the surface of the nanocrystal, thereby causing the nanocrystal at the focus to lose its colloidal stability, so that the subsequent elution process can remove the nanocrystal solution from the laser-untreated area without affecting the laser-treated deposition area, and it cannot be dissolved by the eluent (or form a stable solution in the eluent) and remain on the substrate to form a 3D printed structure.

According to a specific embodiment of the present disclosure, preferably, the $C_3$-$C_{24}$ carbon chain contains one or more structures of carboxyl, amino, phosphine, phosphoric acid, quaternary ammonium salt, sulfonate, and a mercapto group. Examples of crystal surface ligands of the present disclosure include oleic acid, oleylamine, cetyltrimethylammonium bromide (CTAB), mercaptopropionic acid (MPA), and the like.

According to a specific embodiment of the present disclosure, preferably, in step (1), the mass ratio of the inorganic nanocrystal to the photosensitive crosslinkable compound is 1000:1-1:10, more preferably 60:(0.1-10), for example 60:(0.1-10), for example 60:0.1, 60:0.5, 60:1, 60:2, 60:3, 60:5, 60:6, 60:8, 60:9, 60:10 or the like. By controlling the mass ratio of the nanocrystal to the photosensitive crosslinkable compound within the above range, a better nanocrystal printing effect can be achieved. If the ratio of the nanocrystal to the photosensitive crosslinkable compound is too high, the photosensitive crosslinkable compound may not fully achieve the crosslinking and deposition of nanomaterials and affect the tightness of particle linkage. If the ratio of the nanocrystal to the photosensitive crosslinkable compound is too low, the proportion of effective inorganic components in the printed structure may be reduced and the purity of the inorganic nanomaterials in the printing may be reduced.

According to a specific embodiment of the present disclosure, preferably, in step (1), the concentration of the inorganic nanocrystal in the printing solution is 1-600 mg/mL, preferably 100-600 mg/ml.

The solvent in the printing solution of the present disclosure can be routinely selected according to the properties of the surface ligand of the nanocrystal and the photosensitive crosslinkable compound. According to a specific embodiment of the present disclosure, preferably, when the nanocrystal contains a ligand with a long carbon chain (such as hydrocarbons), it can form a stable colloidal solution in a non-polar solvent. The selected photosensitive crosslinkable compound should be dissolved in the selected non-polar solvent. The concentration of the nanocrystal in the printing solution may be 1-600 mg/mL, for example, 2 mg/mL, 30 mg/mL, 60 mg/mL, 120 mg/mL, 200 mg/mL, 300 mg/mL, 600 mg/mL, or the like. In order to control the compactness of the structure during printing, the concentration of the nanocrystal is preferably 100-600 mg/mL. When printing the nanomaterials with polar (ionic) ligands, the solvent for preparing the printing solution is preferably a polar solvent, and the concentration of the nanocrystal in the printing solution may be 50-300 mg/mL, for example, 50 mg/mL, 100 mg/mL, 150 mg/mL, 200 mg/mL, 250 mg/mL, 300 mg/mL, or the like.

According to a specific embodiment of the present disclosure, preferably, the non-polar solvent has a dielectric constant of generally less than 10 and a polarity of less than 4.5. For example, it can be one or more selected from toluene, benzene, chloroform, xylene, carbon tetrachloride, and butyl acetate. The polar solvent has a dielectric constant of generally greater than 10 (or even greater than 30), and for example, it can be one or more selected from N,N-dimethylformamide, N-methylformamide, formamide, dimethyl sulfoxide, acetonitrile, acetone, and water.

According to a specific embodiment of the present disclosure, preferably, in step (2), when the printing is completed, the substrate is soaked in a removal solvent to remove uncrosslinked nanocrystals and unreacted crosslinking agent to preserve the printed structure.

According to a specific embodiment of the invention, preferably, the solvent for preparing the printing solution is the same as the solvent used in the elution process.

According to a specific embodiment of the present disclosure, preferably, the laser is a pulse laser with a wavelength of 400-1,600 nm, a power of 1-100 mW under two-photon absorption, a power of 1-50 μW under single-photon absorption, a direct writing speed of 0.1-50 μm/s, a frequency of 1-1,000 MHz (preferably 10-1000 MHZ), and a pulse width of 1-5,000 fs. Specifically, the laser power may be 2 mW, 4 mW, 6 mW, 10 mW, 50 mW, or the like, and the scanning speed may be 1 μm/s, 2 μm/s, 4 μm/s, 6 μm/s, 8 μm/s, 10 μm/s, or the like. Through the laser intensity in combination with the laser scanning speed, laser scanning frequency, laser pulse width and the like, a specific energy accumulation can be comprehensively achieved, thereby achieving a specific photon energy to realize a fixed-point deposition printing at a specific location.

The curves of single-photon UV absorption and two-photon absorption of chemical-bonding type crosslinkable molecules M460 and M496 as a function of power are shown in FIG. 3. For the chemical-bonding type crosslinkable molecule M460, it is found by selecting molecules in responsive to two bands of 390 nm and 265 nm for comparison that the selected 780 nm femtosecond laser can only achieve the 3D printing effect, when used in combination with the chemical-bonding type crosslinkable molecule M460 in responsive to the 390 nm band. Therefore, the 3D printing method of the present disclosure is based on the absorption of light by photosensitive compounds, and the two-photon absorption mechanism becomes a reasonable mechanism support for the 3D printing of M460 molecules in solution. As shown in FIG. 4, by changing the power of the incident laser, the two-photon absorption response of the chemical-bonding type crosslinkable molecule M460 in responsive to 390 nm at different powers can be observed. The photo responsive range of M460 forms two-photon absorption with the specific laser wavelength.

The present disclosure also provides a 3D structured inorganic nanoscale product, which is printed by the 3D printing method as described above.

According to specific embodiments of the present disclosure, preferably, the structural resolution of the 3D structured inorganic nanoscale product is 150-1,000 nm, more preferably 150 nm.

According to a specific embodiment of the present disclosure, as shown in FIG. 1, the 3D printing method applicable to inorganic nanomaterials specifically includes the following steps.

(1) Preparation of nanocrystal raw material solution (printing solution) for 3D printing: dissolving the pre-synthesized nanocrystal, and nitrene or carbene-based photosensitive molecule in a solvent in a certain ratio and concentration. Herein, the type of nanocrystal may be metals, semiconductors, or metal oxides, and the size thereof is generally 1-1000 nm, and the nanocrystal has a ligand containing a carbon-hydrogen chain (having 3-24 carbon atoms) on the surface thereof. The photosensitive molecule is a photosensitive crosslinkable molecule based on nitrene or carbene.

(2) Laser 3D printing in raw material solution: placing the raw material solution in a solution tank (transparent to the laser wavelength and not reactive with the raw material solvent, such as polydimethoxysilane, PDMS), and covering the paper in the solution tank with glass, silicon wafer, organic substrate, or the like; turning on the nanosecond or femtosecond laser beam and focusing it from bottom to top on the upper surface of the solution (the lower surface of the substrate such as glass), so that the laser can carry out 3D direct writing operation according to a preset program. The surface ligand of the nanocrystal in the laser focus micro-area undergoes a photochemical reaction with the photosensitive molecule to lose the colloidal stability, and the nanocrystal is deposited to form a 3D structure in the areas passed by the direct writing during the printing.

(3) Solvent elution: after printing, separating the substrate with the written 3D structure from the solution, and soaking the substrate with a pure solvent (similar in composition or polarity to the raw material solution) for elution to obtain a 3D structure of inorganic nanomaterials.

In view of the limitations of the prior art, the present disclosure proposes a 3D printing method applicable to inorganic nanomaterials, and a 3D microscale or nanoscale structure of inorganic nanomaterials manufactured by this method. This method uses an inorganic nanocrystal as a raw material, and the material component can be widely derived from semiconductor materials, metals and metal oxides. A certain amount of nitrene or carbene-based crosslinking agent molecules is added to the nanocrystal solution, and the crosslinking agent molecules in the solution is induced with a pulse laser to undergo a single-photon or two-photon reaction. A C—H insertion reaction occurs between the crosslinking agent molecules and the surface ligand of the nanocrystal to crosslink the nanocrystal. The crosslinked nanocrystal loses its colloidal stability and is deposited from the solution to form a 3D structure, while the covalent bonds formed by crosslinking can provide a mechanical support for the 3D structure. An inorganic nanoscale product with a 3D structure is obtained by direct writing in the solution with a pulse laser and eluting the substrate with a solvent. The 3D printing method of nanocrystal based on ligand chemistry according to the present disclosure has the following advantages and notable technical effects, as compared with the prior art.

(1) The printing structural resolution (minimum printing line width) of the obtained product can reach about 150 nm, and the structure is stable.

(2) This method relies on the chemical reaction and deposition of inorganic nanomaterials at the focus of high-energy laser and does not rely on any template.

(3) With the help of covalent bonding of the crosslinking, it is suitable for printing nanocrystals with a variety of different components (different nanocrystal materials) and different geometric structures.

(4) This method maintains the properties such as fluorescence property or dielectric constant of nanocrystals such as semiconductor quantum dots that are inherent before printing. The combination of material versatility with high-resolution structural feature can create a small scale multi-material 3D heterostructures and exhibit a new function associated with the arbitrarily designed 3D structures thereof, enabling innovation and concept expansion in the additive manufacturing method for functional inorganic nanomaterial.

(5) Additionally, low laser power will allow high-throughput, rapid and parallel nanoscale fabrication.

DETAILED DESCRIPTION OF EMBODIMENTS

Figure 1:
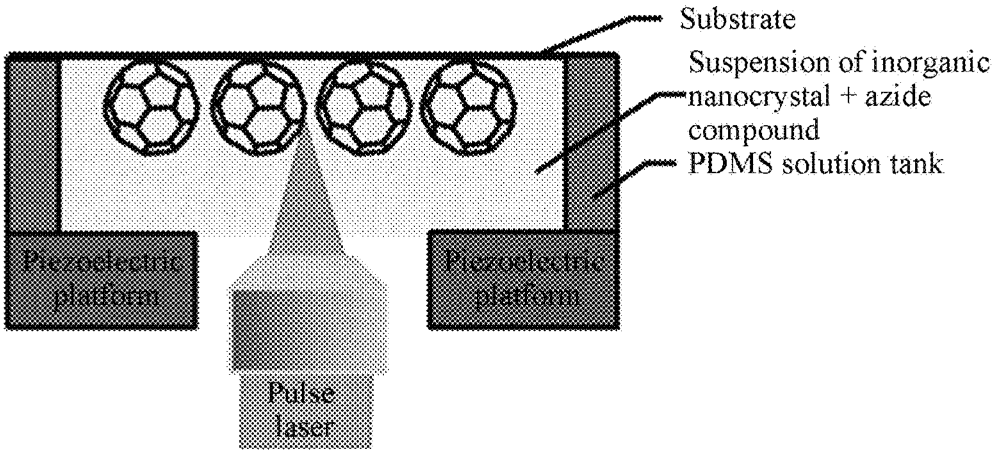
FIG. 1 is a schematic diagram of a printing device for 3D printing of inorganic nanomaterials.
Figure 2:
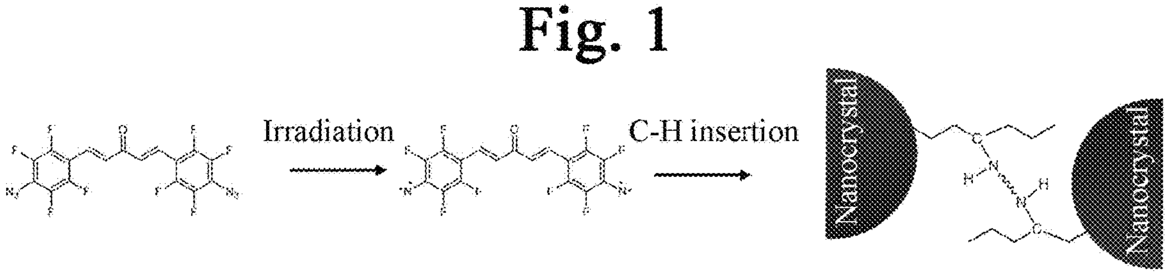
FIG. 2 is a schematic diagram of the chemical mechanism of inducing crosslinkable molecules to crosslink adjacent nanocrystals to achieve a 3D printed structure through the mechanism of two-photon absorption.

In order to have a clearer understanding of the technical features, purposes and beneficial effects of the present disclosure, the technical solutions of the present disclosure will now be described below in details, but it should not be construed as limiting the implementable scope of the present disclosure.

If specific techniques or conditions are not specified in the examples, the techniques or conditions described in the literatures in the art or product specifications will be followed. If the manufacturer of the used reagents or instruments is not specified, they are all conventional products that are commercially available.

Preparation Example 1

This preparation example provides a chemical-bonding type photosensitive crosslinkable compound M460, synthesized by a method as follows (see S. X. Cai, F. John, Evaluation of bis(perfluorophenyl azides) as cross-linkers for a soluble polyimide. J. Mater. Chem. 6, 1249-1252 (1996).):

(1) Synthesis of 4-azido-2,3,5,6-tetrafluorobenzaldehyde: 889 mg of 2,3,4,5,6-pentafluorobenzaldehyde and 300 mg of $NaN_3$ were mixed in 3 mL of $H_2O$ and 8 mL of acetone, and heated to 70° C. and refluxed for 12 hours, during which the reaction solution gradually turned black. The black solution was collected into a 50 mL single-neck flask and subjected to distillation under reduced pressure to remove acetone from the product to obtain a crude product. 50 mL of water was added to the crude product, and then extracted with diethyl ether (3×50 mL). 100 mL of a brine solution was added to the organic phase to remove the residual aqueous phase, and then it was dried for 2 hours with sodium sulfate, concentrated and dried by rotary evaporation, purified by silicone gel column chromatography (petroleum ether:ethyl acetate gradient, 20:1 for final product separation), and dried by rotary evaporation to obtain the product powder of 4-azido-2,3,5,6-tetrafluorobenzaldehyde.

(2) 500 mg of 4-azido-2,3,5,6-tetrafluorobenzaldehyde and 58 mg of acetone were mixed in 3 mL of methanol, and then added to 0.2 mL of 20% NaOH solution. The mixture was agitated at room temperature for 1 hour, and then 2 mL of methanol and 3 mL of water were added thereto and the separated yellow solid was collected. The yellow solid was dried and dissolved in 10 mL of acetone and 500 μL of tetrahydrofuran, and the solution was added dropwise to 100 mL of water, stirred for 2 hours, and subjected to centrifuge, filtration and distillation under reduced pressure to obtain the final yellow powder, i.e., the photosensitive crosslinkable compound 1,5-bis(4-azido-2,3,5,6-tetrafluorophenyl)-1,4-pentadien-3-one (M460).

The NMR data of M460 are as follows:

$^1$H NMR (400 MHZ, $CDCl_3$): δ 7.68 (s, OH), δ 7.30 (s, 2H).

Preparation Example 2

This preparation example provides a chemical-bonding type crosslinking agent compound M496, synthesized by a method as follows (see M. Sundhoro, J. Park, B. Wu, M. Yan, Synthesis of polyphosphazenes by a fast perfluoroaryl azide-mediated staudinger reaction. Macromolecules 51, 4532-4540 (2018), and J. F. Keana, S. X. Cai, New reagents for photoaffinity labeling: synthesis and photolysis of functionalized perfluorophenyl azides. J. Org. Chem. 55, 3640-3647 (1990).):

(1) Into 0.30 g of sodium azide and 0.97 g methyl pentafluorobenzoate, 8 mL of acetone and 10 mL of ultrapure water were added, and the solid powder and liquid were mixed and stirring was started. The heating and reflux operation was carried out for 8 hours. Then the reaction system was cooled to room temperature, and 10 mL of ultrapure water was added thereto. The reaction liquid was removed to a separating funnel, extracted with 10 mL of diethyl ether for three times. The excess extract liquid that could not be removed was removed by drying with magnesium sulfate. The diethyl ether solvent was removed by distillation under reduced pressure, and about 0.9 g of a colorless solid, methyl 4-azido-2,3,5,6-tetrafluorobenzoate was obtained.

(2) 0.8 mL of 20% sodium hydroxide aqueous solution was prepared. 10 mL of methanol and 1 mL of ultrapure water were added thereto and mixed evenly. Then 0.59 g of methyl 4-azido-2,3,5,6-tetrafluorobenzoate synthesized above was weighed. The reaction system was stirred in an ice-water bath, and when concentrated hydrochloric acid was slowly added dropwise, the simultaneous change in pH value was monitored with pH test paper. When the pH of the reaction solution is less than 1, the addition of acid was stopped, and it was extracted with 10 mL of chloroform for three times. After the extraction, it was dried with magnesium sulfate, and the solvent methanol and the extractant chloroform introduced in the reaction were removed by rotary evaporation to finally obtain about 0.5 g of a colorless solid product 4-azido-2,3,5,6-tetrafluorobenzoic acid.

10 mL of anhydrous dichloromethane was added to all of the reaction product solid, and 66 mg of ethylene glycol and 26 mg of 4-dimethylaminopyridine were introduced thereto. The reaction system was mixed, and the reaction was carried out with stirring for 30 min. Then 454 mg of 1-ethyl-(3-dimethylaminopropyl) carbodiimide hydrochloride was added to the reaction system, and reacted overnight with stirring at room temperature. 10 mL of ultrapure water was added thereto, and the reaction was carried out with stirring for 30 min. After the completion of the reaction, it was extracted 3 times with 10 mL of dichloromethane. The organic layer in the extraction system was washed with 50 mL of ultrapure water and 50 mL of saturated brine. The organic solution was separated and dried with magnesium sulfate to remove water. Finally, it was subjected to molecular purification by column chromatography (using n-hexane and ethyl acetate as mobile phase solvent, volume ratio 3:2), and solvent is removed by rotary evaporation, to finally obtain about 350 mg of white solid powder ethylene glycol bis(4-azido-2,3,5,6-tetrafluorobenzoate) (M496).

$^{1}H$ and $^{13}F$ NMR spectrum information of M496 is as follows: $^{1}H$ NMR (400 MHZ, $CDCl_3$): δ 4.68 (s, 4H); $^{19}F$ NMR (377 MHz, $CDCl_3$): δ−150.81 to −150.70 (m, 4F), −138.27 to −138.18 (m, 4F).

Preparation Example 3

This preparation example provides a chemical-bonding type crosslinking agent compound DBTAI, synthesized by a method as follows (see S. H. Khong et al., General photo-patterning of polyelectrolyte thin films via efficient ionic bis(fluorinated phenyl azide) photo-crosslinkers and their post-deposition modification. Adv. Funct. Mater. 17, 2490-2499 (2007).):

(1) 0.29 mL of N,N-bis(3-aminopropyl)methylamine, and 0.55 mL of triethylamine were mixed with 40 mL of chloroform in a 100 mL flask. The above mixture was added dropwise to a mixed solution of 40 mL of chloroform and 0.54 mL of pentafluorobenzoyl chloride. When the addition was completed, the reaction was stopped, and it was filtered to remove the white precipitate, washed three times with 25 mL of saturated sodium chloride solution, and dried with anhydrous $MgSO_4$ to obtain N-methyl-N,N-bis(pentafluorobenzamido) propylamine liquid.

(2) 777 mg of the above-mentioned N-methyl-N,N-bis (pentafluorobenzamido) propylamine liquid was dissolved in 3.2 mL of acetone. 192 mg of sodium azide was dissolved in a mixture solution of 1.5 mL of water and 3 mL of acetone, and the solution of N-methyl-N,N-bis(pentafluorobenzamido)propylamine in acetone was added to the sodium azide solution, refluxed for 8 hours, and filtered to remove the precipitate. After the filtrate was washed with saturated sodium chloride solution, it was dried with $MgSO_4$ and the solvent was evaporated to obtain a yellow solid N-methyl-N,N-bis(4-azido-2,3,5,6-tetrapentafluorobenzamido)propylamine.

(3) 505 mg of N-methyl-N,N-bis(4-azido-2,3,5,6-tetrapentafluorobenzamido)propylamine yellow powder was dissolved in 10 mL of chloroform. 5 mL of methyl iodide was added thereto, stirred overnight, and recrystallized to obtain DBTAI.

$^{1}H$ and $^{13}$ F NMR spectrum information of DBTAI is as follows: $^{1}H$-NMR (400 MHZ, MeOD): δ=3.42 (t, 2H), 3.28 (m, 2H), 3.03 (s, 3H), 2.01 (m, 2H); $^{19}F$-NMR (377 MHz, MeOD): δ=−143.5 (m, 4F), −152.2 (m, 4F).

Preparation Example 4

This preparation example provides a chemical-bonding type crosslinking agent M570, synthesized by referring to the method of Simhadri, C. et al., Flexible polyfluorinated bis-diazirines as molecular adhesives. Chemical Science 2021, 12, 4147-4153.

$^{1}H$ and $^{19}F$ NMR information of M570 is as follows: $^{1}H$ NMR (400 MHZ, $CDCl_3$): δ 7.60 (d, 4H), 7.31 (d, 4H); $^{19}F$ NMR (377 MHz, $CDCl_3$): δ 150.61 (m, 4F), 138.06 (m, 4F).

Example 1

This Example Provides a 3D Printing Method for Nanocrystal Based on Ligand Chemistry In this example, red fluorescent quantum dot CdSe/ZnS nanocrystal (spherical, size 15 nm) was used for 3D laser printing as follows:

(1) Preparation of nanocrystal printing solution: a nanocrystal CdSe/ZnS (600 mg/mL), a photosensitive crosslinkable compound (50 mg/mL), and toluene solvent were mixed to obtain a printing solution, and this printing solution was used for subsequent in-situ printing in solution. Herein, the nanocrystal CdSe/ZnS has the original ligand oleic acid on the surface thereof, and the photosensitive crosslinkable compound is the photosensitive crosslinkable compound M460.

(2) 3D laser printing in solution: the printing solution was sealed in a PDMS solution tank with a cover glass (substrate), and the femtosecond laser beam was turned on to focus on the upper surface of the solution (the lower surface of the cover glass) from bottom to top, allowing the laser to perform 3D direct writing in solution on the cover glass according to a preset program (laser power 4 mW, direct writing speed 3 μm/s, wavelength 780 nm, frequency 80 MHz, pulse width 92 fs). A photochemical reaction of ligands occurred between the nanocrystal and the photosensitive crosslinkable compound in the area where the direct writing passed, so that the colloidal stability was lost, and a deposited 3D structure was formed.

(3) Solvent elution: a clean toluene solvent was used for soaking and elution for 5-10 minutes to remove unreacted photosensitive crosslinkable compound and unreacted nanocrystal to obtain a 3D structured product of CdSe/ZnS nanocrystal.

Figure 5:
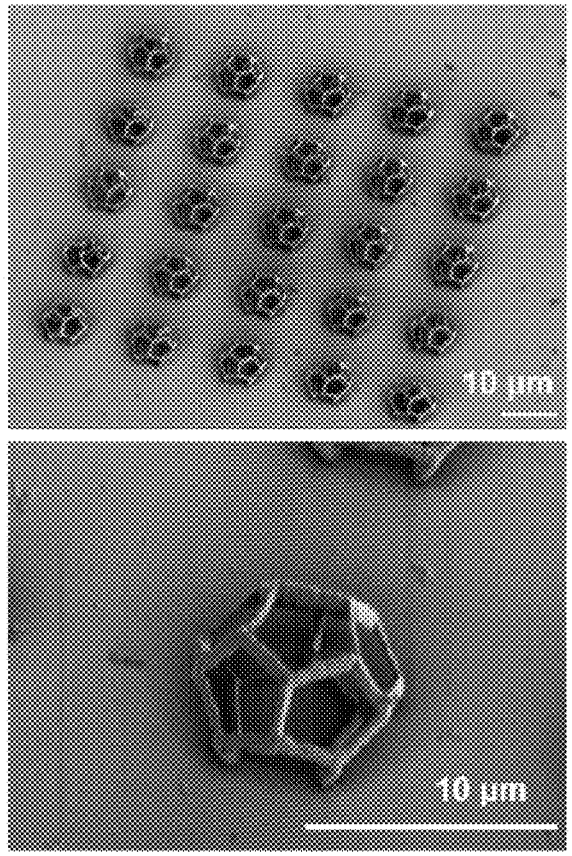
FIG. 5 shows the SEM image after printing using red quantum dot material.
Figure 6:
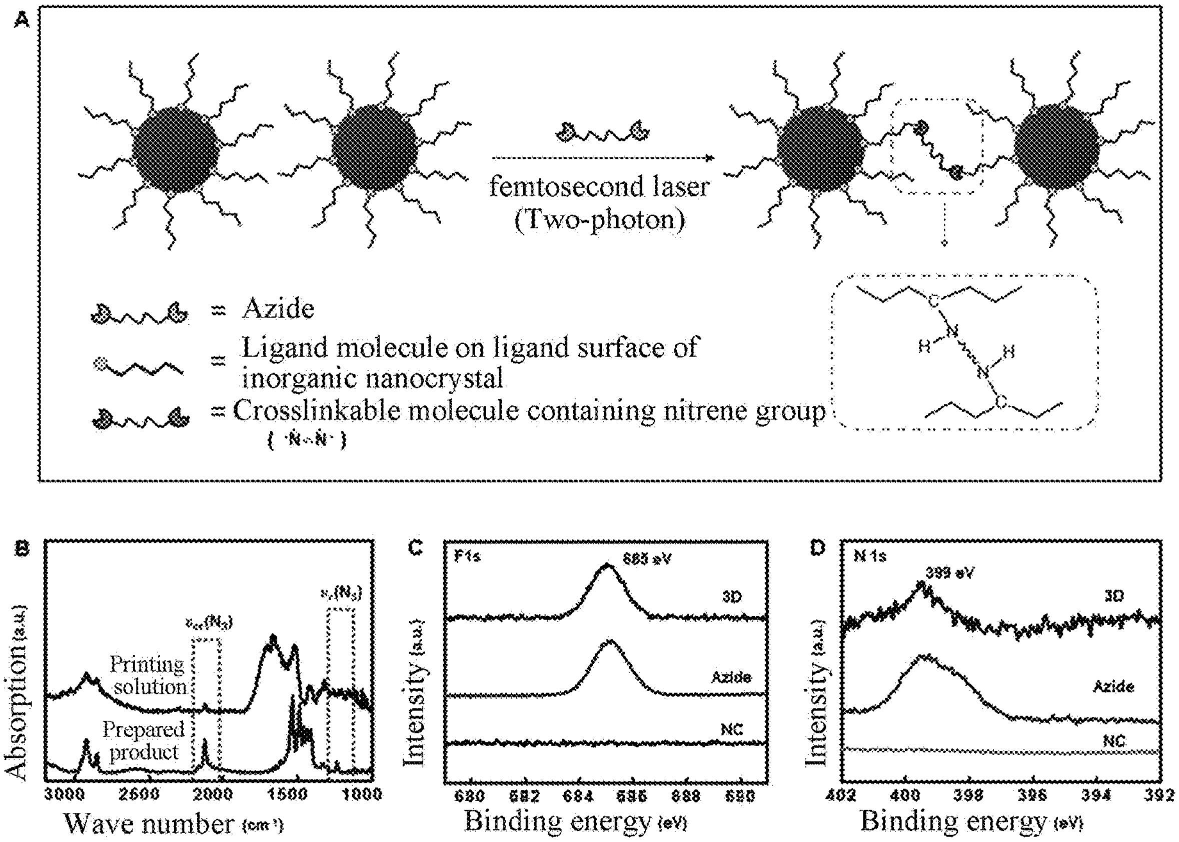
FIG. 6 show (A) a schematic diagram of the molecular mechanism for printing; (B) a graph showing the infrared spectrum analysis before and after printing; and (C) and (D) a graph showing the XPS spectrum analysis of the printed structure, the photosensitive crosslinkable compound and the nanomaterial.

The 3D structured product of CdSe/ZnS nanocrystal produced in this example is shown in FIG. 5. The surface chemical changes reflected by the new mechanism of the printing process are shown in FIG. 6(A), which shows the process of photoinduced C—H insertion reaction in crosslinking of the surface ligand of the nanocrystal with the photosensitive crosslinkable compound; FIG. 6 (C) and (D) show the signal evidence of C—N bond generated in the system after the insertion reaction (XPS spectrum analysis), and FIG. 6 (B) shows the evidence of signal change of $N_3$ azide (FTIR spectrum).

Examples 2-10: Realization of 3D Printing of Various Nanocrystalline Materials Such as Oxides and Perovskite Nanomaterials Nanocrystals with different material components, different compositions of core-shell structures, and different geometric shapes of core-shell structures were used for 3D laser printing in Examples 2-10, respectively. The specific nanocrystals used were red-emitting CdSe/ZnS core-shell quantum dot nanoparticles (size 15 nm), green-emitting CdSe/ZnS core-shell quantum dot nanoparticles (size 12 nm), InP nanocrystals (size 3 nm), CdSe/CdTe core-shell four-jaw nanocrystals (size 35 nm), CdSe (size 4 nm), $TiO_2$ (size 25 nm), and $CsPbBr_3$ (size 7 nm), respectively. The printing process was as follows:

(1) Preparation of nanocrystal printing solution: a nanocrystal (600 mg/mL), a photosensitive crosslinkable compound (50 mg/mL), and toluene solvent were mixed to obtain a printing solution, and this printing solution was used for subsequent in-situ printing in solution. Herein, the nanocrystal has the original ligand oleic acid or oleylamine on the surface thereof, and the photosensitive crosslinkable compound is the photosensitive crosslinkable compound M460.

(2) 3D laser printing in solution: the printing solution was sealed in a PDMS solution tank with a cover glass (substrate), and the femtosecond laser beam was turned on to focus on the upper surface of the solution (the lower surface of the cover glass) from bottom to top, allowing the laser to perform 3D direct writing in solution on the cover glass according to a preset program (laser power 4 mW, direct writing speed 4 μm/s, wavelength 780 nm, frequency 80 MHz, pulse width 92 fs). A photochemical reaction of ligands occurred between the nanocrystal and the photosensitive crosslinkable compound in the area where the direct writing passed, so that the colloidal stability was lost, and a deposited 3D structure was formed.

(3) Solvent elution: a clean toluene solvent was used for soaking and elution for 5-10 minutes to remove unreacted photosensitive crosslinkable compound and unreacted nanocrystal to obtain a 3D structured product of the nanocrystal.

Figure 7:
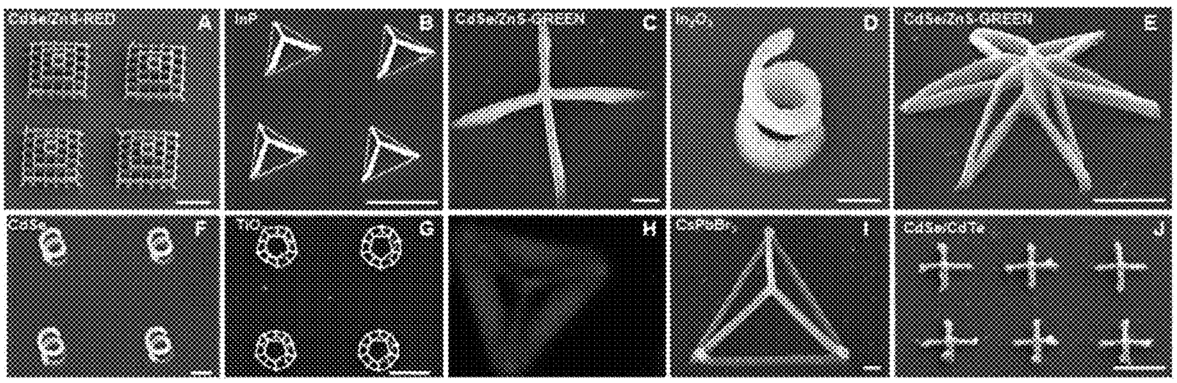
FIG. 7 is a diagram of a printed structure of various nanomaterials (composition, structure): (A). CdSe/ZnS red quantum dot; (B). InP nanocrystal; (C). CdSe/ZnS green quantum dot; (D). $In_2O_3$ nanocrystal; (E). CdSe/ZnS green quantum dot; (F). CdSe nanocrystal; (G). $TiO_2$ nanocrystal, (H) and (I). $CsPbBr_3$ nanocrystal (SEM and fluorescence images); (J). CdSe/CdTe four-jaw core-shell structured nanocrystal. Scale: 10 μm (A, B, G), 5 μm (E, J), 1 μm (C, I), 2 μm (D, F).

The 3D printed structure of the inorganic nanomaterials prepared in Examples 2-10 is shown in FIG. 7.

Example 11: Realization of 3D Printing of Metal Nanomaterials

In this example, metal nanocrystal Ag-MPA ligand (size 10 nm) and Au-CTAB ligand (size 70 nm) were used for 3D laser printing, respectively. The process was as follows:

(1) Preparation of nanocrystal printing solution: the metal nanocrystal Ag-MPA ligand or Au-CTAB ligand (100 mg/mL), the photosensitive crosslinkable compound DBTAI (10 mg/mL), and the solvent water were mixed to obtain a printing solution, and this printing solution was used for subsequent in-situ printing in solution.

(2) 3D laser printing in solution: the printing solution was sealed in a PDMS solution tank with a cover glass (substrate), and the femtosecond laser beam (515 nm) was turned on to focus on the upper surface of the solution (the lower surface of the cover glass) from bottom to top, allowing the laser to perform 3D direct writing in solution on the cover glass according to a preset program (laser power 0.2 mW, direct writing speed 1 μm/s, wavelength 515 nm, frequency 0.2 MHz, pulse width 400 fs). A photochemical reaction of ligands occurred between the nanocrystal and the photosensitive crosslinkable compound in the area where the direct writing passed, so that the colloidal stability was lost, and a deposited 3D structure was formed.

(3) Solvent elution: a clean solvent water was used for soaking and elution for 5-10 minutes to remove unreacted photosensitive crosslinkable compound and unreacted nanocrystal to obtain a 3D structured product of the metal Ag and Au nanocrystals.

Figure 8:
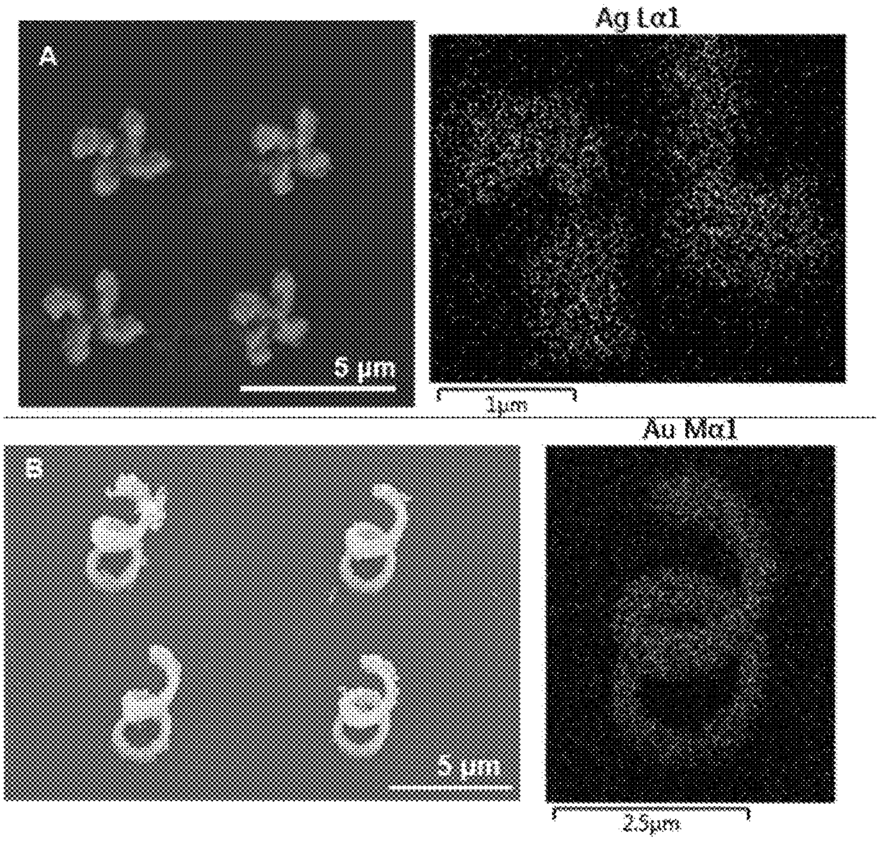
FIG. 8 is the SEM and EDS analysis results of 2D patterns and 3D helical structures printed from Ag and Au nanoparticles.

The 3D printed structures of the inorganic nanomaterials Ag and Au prepared in this example are shown in FIG. 8 (A) and (B), respectively.

Example 12: Realization of High-Resolution Printing

In this example, red-emitting quantum dot CdSe/ZnS nanocrystal (spherical, size 15 nm) was used for 3D laser printing as follows:

(1) Preparation of nanocrystal printing solution: a nanocrystal CdSe/ZnS (600 mg/mL), a photosensitive crosslinkable compound (50 mg/mL), and toluene solvent were mixed to obtain a printing solution, and this printing solution was used for subsequent in-situ printing in solution. Herein, the nanocrystal CdSe/ZnS has the original ligand oleic acid on the surface thereof, and the photosensitive crosslinkable compound is the photosensitive crosslinkable compound M460.

(2) 3D laser printing in solution: the printing solution was sealed in a PDMS solution tank with a cover glass (substrate), and the femtosecond laser beam was turned on to focus on the upper surface of the solution (the lower surface of the cover glass) from bottom to top, allowing the laser to perform 3D direct writing in solution on the cover glass according to a preset program (laser power 3 mW, direct writing speed 4 μm/s, wavelength 780 nm, frequency 80 MHz, pulse width 92 fs). A photochemical reaction of ligands occurred between the nanocrystal and the photosensitive crosslinkable compound in the area where the direct writing passed, so that the colloidal stability was lost, and a deposited 3D structure was formed.

(3) Solvent elution: a clean toluene solvent was used for soaking and elution for 5-10 minutes to remove unreacted photosensitive crosslinkable compound and unreacted nanocrystal to obtain a 3D structured product of CdSe/ZnS nanocrystal.

Figure 9:
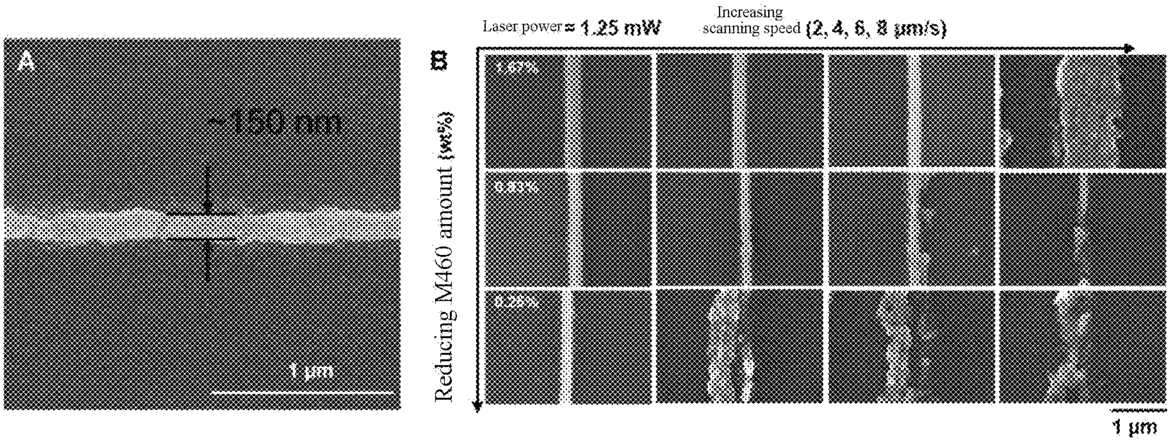
FIG. 9 shows (A) a high-resolution printed line pattern; (B) printed line arrays at different ratios of red quantum dot nanocrystals to crosslinking agent.

The red quantum dot pattern produced in this example can obtain a high-resolution pattern of about 150 nm, as shown in FIG. 9 (A). The printed line arrays at different ratios of the red quantum dot nanocrystal to the crosslinking agent prepared in this example are shown in FIG. 9 (B), where the percentage is the mass percentage of the photosensitive crosslinkable compound with respect to the nanocrystal.

Example 13: Realization of Heterostructure Printing and Lossless Printing with Maintained PL Performance In this example, red-, green- and blue-emitting quantum dot CdSe/ZnS nanocrystals (spherical, size 8-15 nm) were sequentially used for laser printing as follows:

(1) Preparation of nanocrystal printing solution: the red-emitting quantum dot CdSe/ZnS nanocrystal (600 mg/mL), a photosensitive crosslinkable compound (50 mg/mL), and toluene solvent were mixed to obtain a printing solution, and this printing solution was used for subsequent in-situ printing in solution. Herein, the nanocrystal has the original ligand oleic acid on the surface thereof, and the photosensitive crosslinkable compound is the photosensitive crosslinkable compound M460.

(2) 3D laser printing in solution: the printing solution was sealed in a PDMS solution tank with a cover glass (substrate), and the femtosecond laser beam was turned on to focus on the upper surface of the solution (the lower surface of the cover glass) from bottom to top, allowing the laser to perform 3D direct writing in solution on the cover glass according to a preset program (laser power 4 mW, direct writing speed 3 μm/s, wavelength 780 nm, frequency 80 MHz, pulse width 92 fs). A photochemical reaction of ligands occurred between the nanocrystal and the photosensitive crosslinkable compound in the area where the direct writing passed, so that the colloidal stability was lost, and a deposited 3D structure was formed.

(3) Solvent elution: a clean toluene solvent was used for soaking and elution for 5-10 minutes to remove unreacted photosensitive crosslinkable compound and unreacted nanocrystal to obtain the first batch of array of 3D structure of the nanocrystal.

(4) The printing process from steps (1) to (3) was repeated twice, and green- and blue-emitting quantum dot CdSe/ZnS nanocrystals were used instead for heterogeneous printing of parallel arrays.

Figure 10:
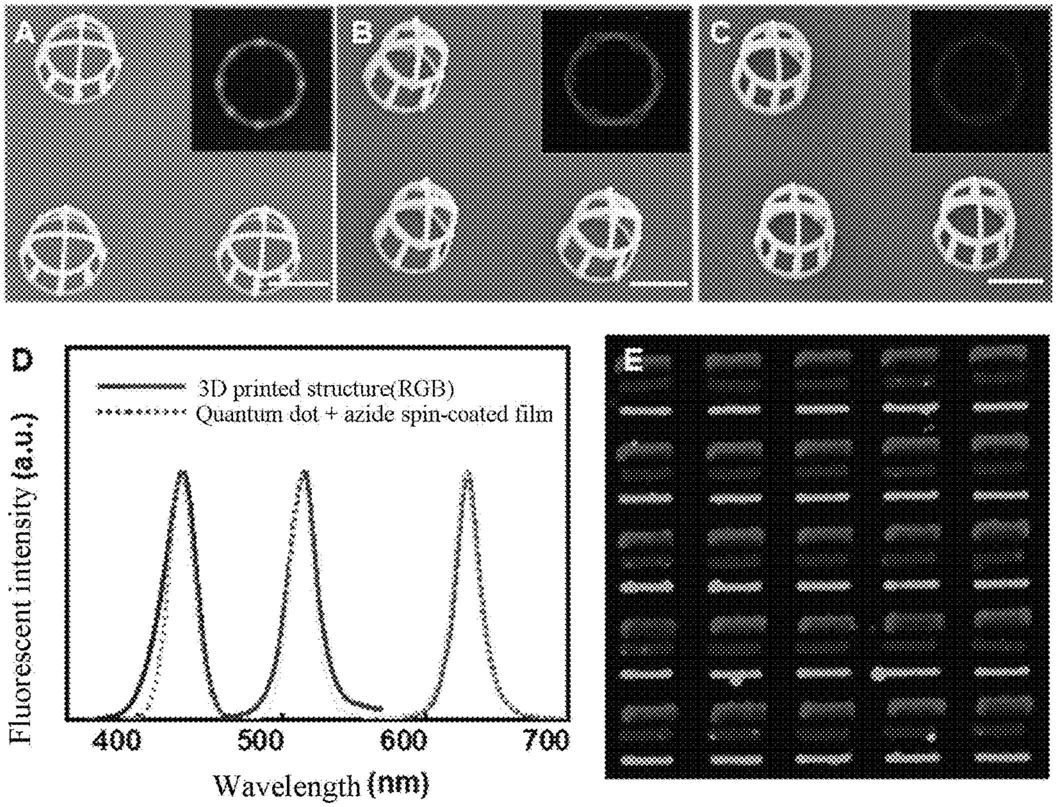
FIG. 10 shows a dome structure printed from RGB three-color quantum dots (A-C), an analysis of change in PL fluorescence spectrum before and after printing (D), and the fluorescence image of a heterogeneous array pattern printed from RGB three-color quantum dots (E).

FIG. 10 shows a dome structure printed from RGB three-color quantum dots in this example (A-C), an analysis of change in PL fluorescence spectrum before and after printing (D), and the fluorescence photo of a heterogeneous array pattern printed from RGB three-color quantum dots (E).

Test Example 1: Realization of Printing of Oxide Nanomaterials with Maintained Refractive Index In this test example, titanium dioxide nanocrystal film samples were first prepared under the following different conditions, and the refractive index of each film was measured:

1. pure $TiO_2$ nanocrystal spin-coated film (100 mg/ml);
2. a film obtained by mixing and spin-coating $TiO_2$ (size 25 nm) and photosensitive crosslinkable compound M460 (mass ratio: 600:1) and exposing it for crosslinking;
3. a film after crosslinking and ligand stripping ($NOBF_4$ (0.1 M acetonitrile solution), soaking for 1 minute for ligand stripping).

The spin coating speed for the three groups of samples was 1000 rpm and the spin coating time was 30 seconds. The refractive index of each film (thickness ~100 nm) on a silicon wafer was measured on a Horiba UVISEL ellipsometer.

Figure 11:
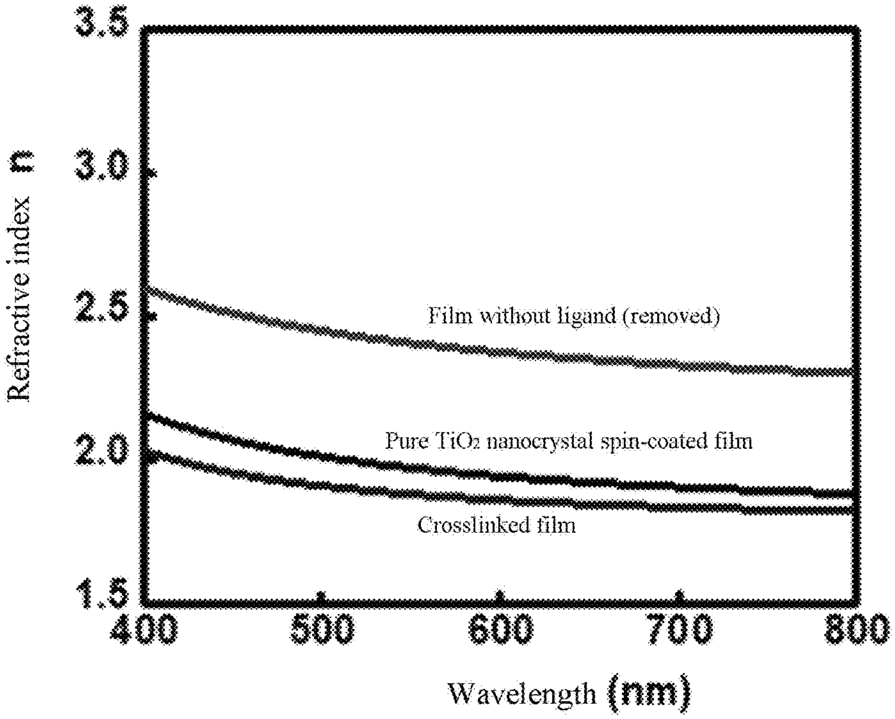
FIG. 11 is a graph of refractive index data of titanium dioxide nanocrystal films under three different processing conditions.

The refractive index results of titanium dioxide nanocrystal films produced under three different processing conditions in this test example are shown in FIG. 11.

Figure 12:
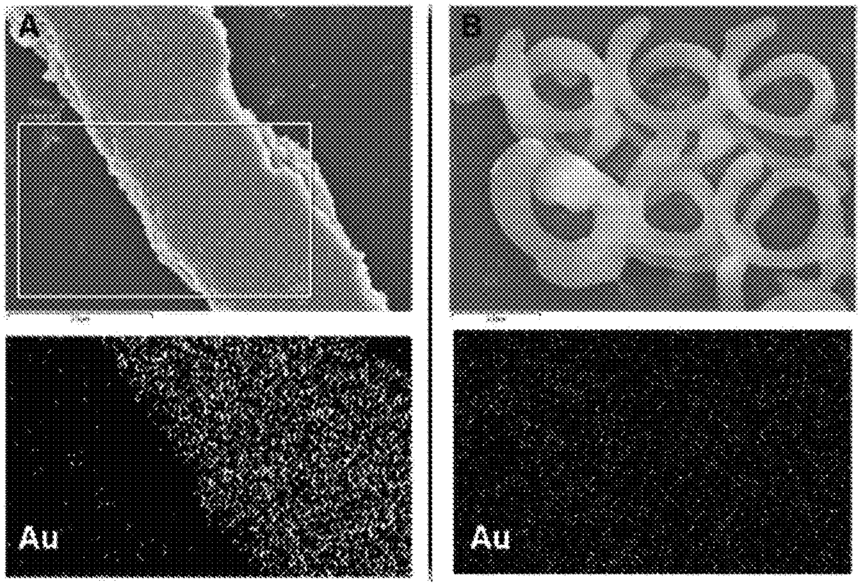
FIG. 12 shows the SEM and EDS analysis of the printed structures printed from Au NRs (CTAB) and Au NRs (PEG-SH), respectively.

Test Example 2: Investigation of the Impact of Polymers on Printing Purity During Printing Au NRs (CTAB) and Au NRs (PEG-SH) with a size of 70 nm were used respectively with the photosensitive crosslinkable compound DBTAI (the mass ratio of the nanocrystal to the photosensitive crosslinkable compound is 10:1) for 3D printing in solution (referring to Example 11 for printing process). The obtained structures are shown in FIG. 12 (A) (Au NRs (CTAB)) and B (Au NRs (PEG-SH)). The gold nanorod materials are all Au nanorods whose surface is stabilized by long-chain ligands. The purity of the inorganic part of the two structures in FIG. 12 is observed.

It can be seen from FIG. 12 that the ratio of Au in the structural components obtained by the printing experiment using gold rods with polymer ligands is significantly decreased, while the crosslinking effect in the printing experiment using the original short-chain ligand CTAB is not affected, in which a dense structure can still be seen by SEM, and the Au component in the printed structure is very obvious, indicating that the participation of polymers in printing has a great impact on the purity of the printed structure.

Figure 3:
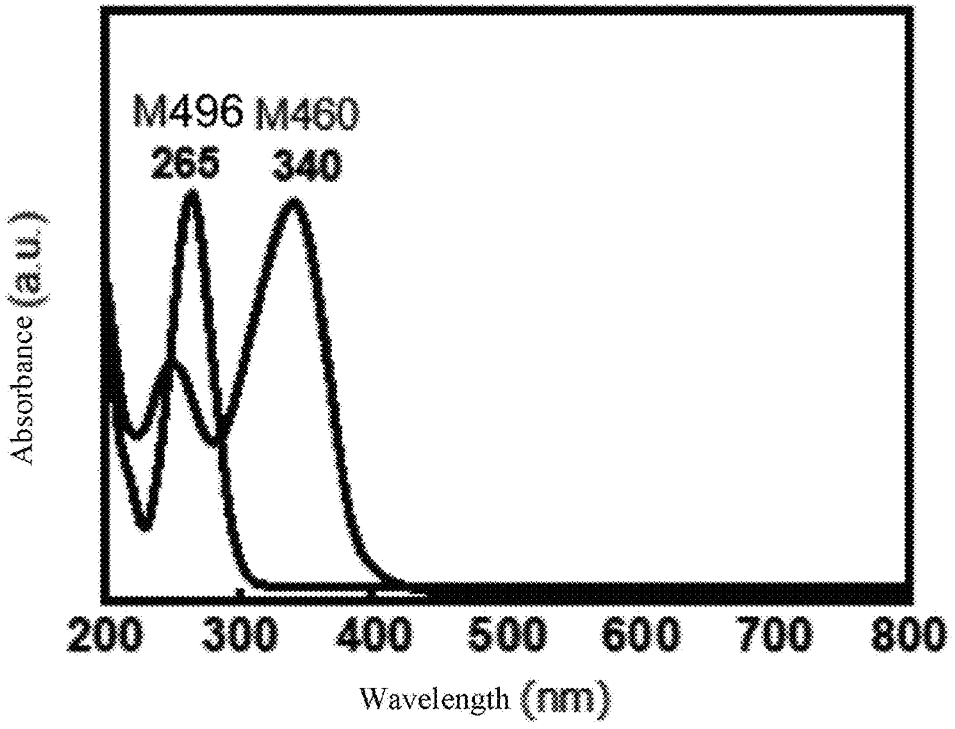
FIG. 3 is the ultraviolet absorption spectra of two photosensitive crosslinkable compounds with different absorbability.
Figure 4:
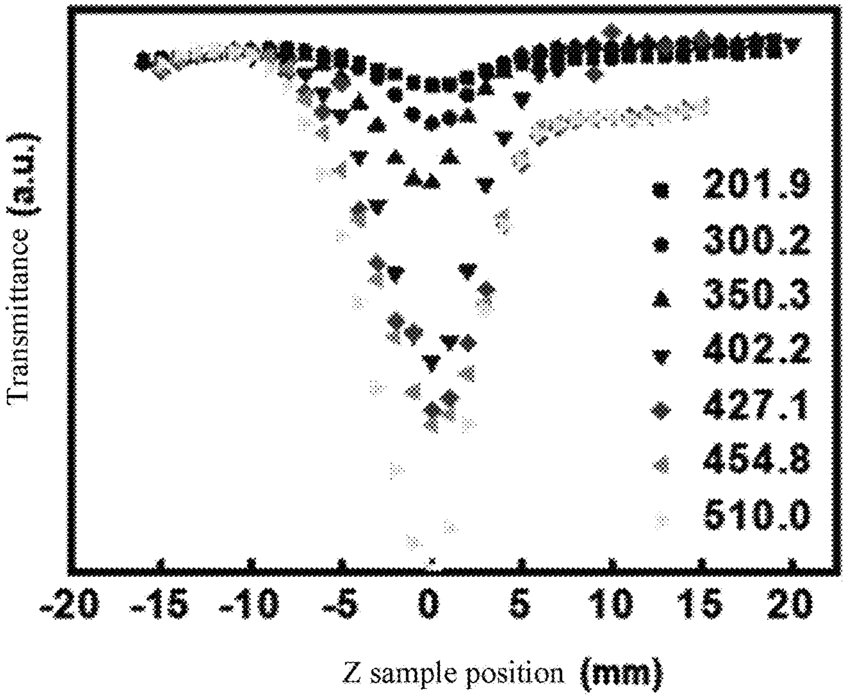
FIG. 4 is a graph showing the change in transmittance of M460 molecules as a function of different laser intensities.

Test Example 3: Comparison of Printing Effects of Chemical-Bonding Type Crosslinkable Molecules Responsive to Different UV Bands The 3D printing method used in this test example is the same as the printing method in Example 1 (the mass ratio of the nanocrystal to the photosensitive crosslinkable compounds is 12:1, the laser power is 4 mW, and the direct writing speed is 4 μm/s), except that M496 molecules, which absorb light of around 265 nm, are used as crosslinked molecules. The UV absorption spectrum is shown in FIG. 3. It can be seen from the printing process that the change of different laser powers and direct writing speeds will not allow 3D structures to be deposited by printing in the solution, and even 2D structures cannot be formed; however, printing can be achieved under a 515 nm light source. This test example shows that for the light source of 780 nm, only the crosslinkable molecule M460 that absorbs near half the wavelength can realize printing in this system. For the 515 nm light source, the crosslinkable molecule M496 that absorbs near half the wavelength can realize printing, reflecting M460 and M496 in this 3D printing system relying on the chemical mechanism of two-photon absorption.

Figure 13:
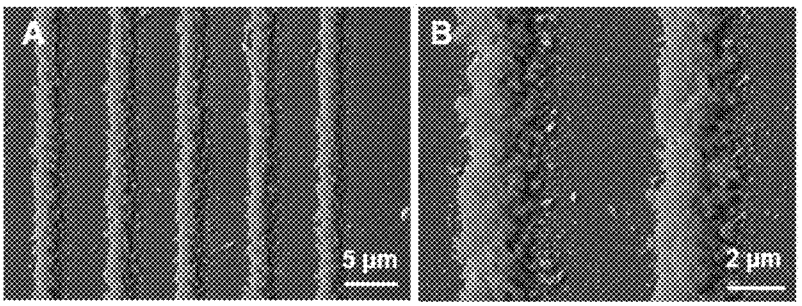
FIG. 13 is an SEM image of a structure printed with a 325 nm ultraviolet laser using the single-photon absorption of the photosensitive crosslinkable compound.

Test Example 4: Printing Effect of Chemical-Bonding Crosslinkable Molecules with Single Photon Absorption In this test example, a low-energy (4 μW) 325 nm continuous laser is used as the light source to induce a photochemical bonding reaction through a single-photon absorption process: mixing 5 μL of 600 mg/mL green-emitting CdSe/ZnS quantum dot having the original ligand oleic acid, together with 0.5 μL of 50 mg/mL M460 molecules and toluene solvent. Under 4 μW laser condition, the printing of II-VI quantum dots can be achieved using a 50× magnification and a 0.4NA objective lens at different scanning speeds (5 μm/s, 10 μm/s, 20 μm/s), as shown in FIG. 13(A) and (B). Therefore, this technology can be integrated with various existing laser printing systems to achieve 3D printing with adjustable accuracy and cost.

In this specification, reference to the terms "one embodiment", "some embodiments", "an example", "specific example", "some examples" or the like means that specific features, structures, materials or features described in connection with the embodiment or example are included in at least one embodiment or example of the present disclosure. In this specification, the schematic expressions of the above terms are not necessarily directed to the same embodiment or example. Furthermore, the described specific features, structures, materials or features may be combined in any suitable manner in any one or more embodiments or examples. In addition, those skilled in the art may combine different embodiments or examples and features of different embodiments or examples described in this specification, unless they are inconsistent with each other.

Although the embodiments of the present disclosure have been shown and described above, it can be understood that the above-mentioned embodiments are illustrative and should not be construed as limiting the present disclosure. Those of ordinary skill in the art can make changes, modifications, substitutions and variations to the above-mentioned embodiments within the scope of the present disclosure.

What is claimed is:

1. A 3D printing method applicable to inorganic nanomaterials, including the steps of:

(1) mixing an inorganic nanocrystal and a photosensitive crosslinkable compound in a solvent to obtain a printing solution; wherein the inorganic nanocrystal has a ligand containing a carbon-hydrogen bond on the surface thereof;

(2) performing laser 3D printing to obtain a 3D printed product;

wherein the photosensitive crosslinkable compound is a nitrene-based photosensitive crosslinking agent and/or a carbene-based photosensitive crosslinking agent.

2. The 3D printing method according to claim 1, wherein the inorganic nanocrystal includes one or more of a metal nanocrystal, a metal oxide nanocrystal, and a semiconductor material nanocrystal.

3. The 3D printing method according to claim 1, wherein the photosensitive crosslinkable compound is an azide-based compound or a diazirine-based compound.

4. The 3D printing method according to claim 3, wherein the azide-based compound has a structure represented by Formula I:

Formula I

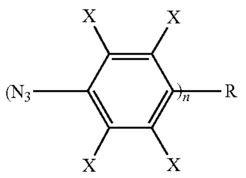

in Formula I, each X is independently selected from F or an alkyl, at least one X is F, and R is selected from a hydrocarbyl and derivatives thereof, an aryl and derivatives thereof, or an ester group and derivatives thereof, $n \geq 2$;

the diazirine-based compound has a structure represented by Formula II:

Formula II

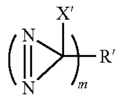

in Formula II, X' is selected from H, halogen, a hydrocarbyl and derivatives thereof, and an ether group and derivatives thereof, R' is a hydrocarbyl or derivatives thereof; and $m \geq 2$.

5. The 3D printing method according to claim 4, wherein R is a $C_{1-8}$ hydrocarbyl and derivatives thereof, or a $C_{6-12}$ aryl and derivatives thereof.

6. The 3D printing method according to claim 4, wherein n is 2, 3, 4, 5 or 6.

7. The 3D printing method according to claim 4, wherein R contains one or more heteroatom(s) of O, N, P, and halogen atoms.

8. The 3D printing method according to claim 4, wherein R' contains one or more structure(s) of an ester group, an amido bond, an aryl, and an ether group.

9. The 3D printing method according to claim 1, wherein the photosensitive crosslinkable compound is one or more of 1,5-bis(4-azido-2,3,5,6-tetrafluorophenyl)-1,4-pentadien-3-one, ethylene glycol bis(4-azido-2,3,5,6-tetrafluorobenzoate), N,N-dimethyl-N,N-trimethylenebis(4-azido-2,3,5,6-tetrafluorobenzamide)ammonium iodide, and 3,3'-((perfluorobutane-1,4-diyl)bis(4,1-phenylene))bis(3-(trifluoromethyl)-3H-diazirine).

10. The 3D printing method according to claim 1, wherein the absorption wavelength range of the photosensitive crosslinkable compound and the wavelength of the laser for 3D printing are in accordance with single-photon absorption or two-photon absorption.

11. The 3D printing method according to claim 1, wherein the ligand on the surface of the inorganic nanocrystal has a carbon chain of $C_3$-$C_{24}$ as the main chain.

12. The 3D printing method according to claim 11, wherein the main chain contains carbon-hydrogen bonds.

13. The 3D printing method according to claim 11, wherein the carbon chain of $C_3$-$C_{24}$ contains one or more structure(s) of a carboxyl group, an amine group, phosphine, phosphoric acid, quaternary ammonium salt, a sulfonate group, and a mercapto group.

14. The 3D printing method according to claim 1, wherein in step (1), the mass ratio of the inorganic nanocrystal to the photosensitive crosslinkable compound is 1000:1-1:10.

15. The 3D printing method according to claim 14, wherein in step (1), the mass ratio of the inorganic nanocrystal to the photosensitive crosslinkable compound is 60:(0.1-10).

16. The 3D printing method according to claim 1, wherein in step (1), the concentration of the inorganic nanocrystal in the printing solution is 1-600 mg/mL.

17. The 3D printing method according to claim 16, wherein in step (1), the concentration of the inorganic nanocrystal in the printing solution is 100-600 mg/ml.

18. The 3D printing method according to claim 1, wherein in step (2), the laser is a pulse laser with a wavelength of 400-1,600 nm, a power of 1-100 mW under two-photon absorption, a power of 1-50 μW under single-photon absorption, a direct writing speed of 0.1-50 μm/s, a frequency of 1-1,000 MHz, and a pulse width of 1-5,000 fs.

19. A 3D structured inorganic nanoscale product, which is printed by the 3D printing method according to claim 1.

20. The 3D structured inorganic nanoscale product according to claim 9, wherein the structural resolution of the 3D structured inorganic nanoscale product is 150-1,000 nm.

* * * * *